(12) United States Patent
Chinn et al.

(10) Patent No.: US 6,900,133 B2
(45) Date of Patent: May 31, 2005

(54) METHOD OF ETCHING VARIABLE DEPTH FEATURES IN A CRYSTALLINE SUBSTRATE

(75) Inventors: Jeffrey D. Chinn, Foster City, CA (US); Michael B. Rattner, Santa Clara, CA (US); James A. Cooper, San Jose, CA (US); Rolf A. Guenther, Monte Sereno, CA (US)

(73) Assignee: Applied Materials, INC, Santa Clara, CA (US)

(*) Notice: Subject to any disclaimer, the term of this patent is extended or adjusted under 35 U.S.C. 154(b) by 180 days.

(21) Appl. No.: 10/247,467

(22) Filed: Sep. 18, 2002

(65) Prior Publication Data

US 2004/0053505 A1 Mar. 18, 2004

(51) Int. Cl.[7] .................... H01L 21/302; H01L 21/3065
(52) U.S. Cl. .................... 438/700; 438/703; 438/706; 438/719; 438/745
(58) Field of Search .................... 438/700, 703, 438/706, 719, 745

(56) References Cited

U.S. PATENT DOCUMENTS

| | | | |
|---|---|---|---|
| 4,533,430 A | | 8/1985 | Bower .................... 156/643 |
| 4,795,529 A | | 1/1989 | Kawasaki et al. .................... 156/643 |
| 5,501,893 A | | 3/1996 | Laermer et al. .................... 428/161 |
| 5,534,359 A | * | 7/1996 | Bartha et al. .................... 428/688 |
| 5,710,076 A | * | 1/1998 | Dai et al. .................... 438/305 |
| 5,837,113 A | | 11/1998 | Suzuki et al. .................... 204/420 |
| 5,913,118 A | * | 6/1999 | Wu .................... 438/243 |
| 6,033,977 A | * | 3/2000 | Gutsche et al. .................... 438/618 |
| 6,084,175 A | * | 7/2000 | Perry et al. .................... 136/256 |
| 6,093,362 A | | 7/2000 | Kaltenbach et al. .................... 264/400 |
| 6,127,273 A | | 10/2000 | Laermer et al. .................... 438/709 |
| 6,174,817 B1 | * | 1/2001 | Doshi et al. .................... 438/706 |
| 6,180,533 B1 | * | 1/2001 | Jain et al. .................... 438/714 |
| 6,207,534 B1 | * | 3/2001 | Chan et al. .................... 438/427 |
| 6,214,686 B1 | * | 4/2001 | Divakaruni et al. .................... 438/386 |
| 6,232,171 B1 | * | 5/2001 | Mei .................... 438/246 |
| 6,284,148 B1 | | 9/2001 | Laermer et al. .................... 216/37 |
| 6,440,816 B1 | * | 8/2002 | Farrow et al. .................... 438/401 |
| 6,514,423 B1 | * | 2/2003 | Ng et al. .................... 216/38 |

FOREIGN PATENT DOCUMENTS

| | | | |
|---|---|---|---|
| WO | WO 00/65137 A1 | 11/2000 | ............ D04B/9/20 |
| WO | WO 01/06239 A2 | 1/2001 | .......... G01N/21/77 |
| WO | WO 01/26799 A1 | 4/2001 | ............ B01J/19/00 |
| WO | WO 02/26114 A2 | 4/2002 | |

OTHER PUBLICATIONS

M. Llie et al., "Micromachined chips for biomolecular investigation." Proc. of 2nd euspen International Conference—Turin, Italy. (May 27, 2001–May 31, 2001). pp. 16–19.

Akio Oki et al., "Study of Elemental Technologies for Creation of Healthcare Chip Fabricated on Polyethylene Terephthalate Plate." IEICE Trans. Electron., vol. E84–C, No. 12 (Dec. 2001). pp. 1801–1806.

Ye et al., "0.35–Micron and Sub–0.35–Micron Metal Stack Etch in a DPS Chamber—DPS Chamber and Process Characterization." Electrochemical Society Proceedings, vol. 96012, pp. 222–233 (1996).

Presently pending patent application: J. Chinn et al., "" U.S. Appl. No. 10/210,929 filed Aug. 2, 2002.

* cited by examiner

*Primary Examiner*—Nadine G. Norton
*Assistant Examiner*—Lynette T. Umez-Eronini
(74) *Attorney, Agent, or Firm*—Shirley L. Church

(57) ABSTRACT

Disclosed herein is an easy and well-integrated method of etching features to different depths in a crystalline substrate, such as a single-crystal silicon substrate. The method utilizes a specialized masking process and takes advantage of a highly selective etch process. The method provides a system of interconnected, variable depth reservoirs and channels. The plasma used to etch the channels may be designed to provide a sidewall roughness of about 200 nm or less. The resulting structure can be used in various MEMS applications, including biomedical MEMS and MEMS for semiconductor applications.

21 Claims, 7 Drawing Sheets

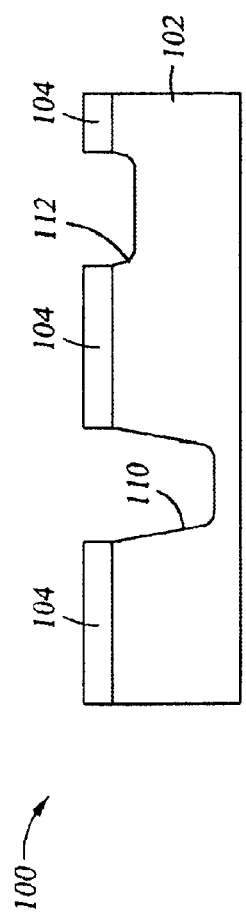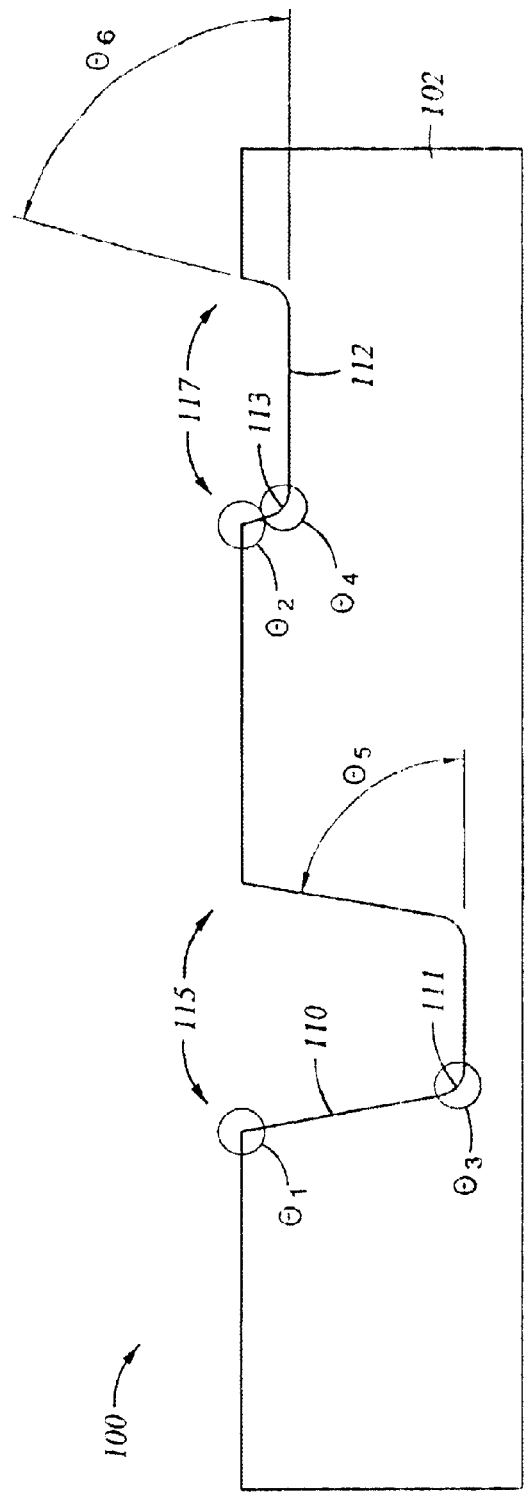

METHOD OF ETCHING VARIABLE DEPTH FEATURES IN A CRYSTALLINE SUBSTRATE

BACKGROUND OF THE INVENTION

1. Field of the Invention

The present invention pertains to a method of etching features to different depths, and with different etched surface finishes, in a crystalline substrate. In particular, the invention pertains to a method of etching a system of interconnected, variable depth microfluid reservoirs and channels in a crystalline substrate, such as a silicon substrate.

2. Brief Description of the Background Art

The trend in chemical and biochemical sample analysis, and especially in separation systems such as liquid chromatography and capillary electrophoresis systems, is toward smaller and smaller device dimensions. The smaller dimensions are required in some instances to meet performance requirements, and in other instances provide improved performance or reduced analysis costs. In this regard, miniaturized separation systems provide a variety of benefits as compared with conventional separation systems. Some of these benefits includes: 1) more effective system design; 2) increased speed of analysis; 3) decreased sample and solvent consumption; and 4) the possibility of increased detection efficiency.

Several approaches toward miniaturization of liquid phase analysis systems have been developed in the art. Typically, the analytical instrumentation itself has not been reduced in size; rather, it is the size of a separation compartment, for example, which has been significantly reduced. Miniaturized separation compartments for use in an analytical device often consist of a system of interconnected reservoirs and channels. The reservoirs are used to hold samples of analytes to be separated; the rate at which a sample travels down a channel may be used as a basis for determining the composition of the sample, or as a technique for separating compositions within a sample. The reservoirs are typically formed to hold a liquid volume ranging from about 5 picoliters to about 100 picoliters. The interconnecting channels typically have a cross-sectional area on the order of about 100 $\mu m^2$ to about 10,000 $\mu m^2$.

There are problems inherent in the miniaturization of interconnecting channels to such small dimensions. For example, the sidewalls of the channel must be very smooth in order to precisely calculate the exact volume of fluid which can be contained within the channel. Any variation in channel dimensions resulting from non-uniform sidewalls will result in a deviation from the calculated channel volume. Deviation from the calculated channel volume will ultimately affect the results of chemical analyses performed using such separation systems. In addition, sidewall roughness in a channel may affect the fluid-flow characteristics of fluids flowing through the channel, also affecting the analytical results.

SUMMARY OF THE INVENTION

We have developed an easy and well-integrated method of etching features having different depths, such as reservoirs and channels, in a silicon substrate. The method utilizes a specialized masking process. Also disclosed is a highly selective silicon etch process for use with a silicon substrate. The etch process can be adjusted to provide features having a sidewall roughness of about 200 nm or less.

One embodiment of the invention is a method of etching two or more patterns to different depths in a single-crystal silicon substrate. A hard mask, typically a silicon oxide layer, overlying the silicon substrate is pattern etched, using a first patterned photoresist layer as a mask, to form a patterned hard mask for subsequent etching of both deeply etched features and more shallow features. After etching of the hard mask, the first photoresist layer is removed, then a second patterned photoresist layer is formed over all of the patterned hard mask surfaces and a portion of the open areas through the hard mask. The second photoresist layer blocks off openings in the hard mask (silicon oxide) that will be used for subsequent etching of shallow features. A deep etch is then performed, using the second patterned photoresist layer as a mask and employing a plasma source gas composition that provides rapid silicon etching, with selective etching of the silicon relative to the photoresist. Etching of deep features is typically performed to an etch depth which is slightly less than the desired final etch depth for the deep features. The second photoresist layer is then removed. A shallow etch is then performed, using the entire patterned hard mask as the masking layer, and employing a plasma source gas composition that is highly selective to etching silicon relative to the hard mask (relative to silicon oxide, for example), to provide a shallow feature. The plasma used to etch the shallow features may be designed to provide a sidewall roughness of about 100 nm or less. Continued etching of the deeply etched features to their final desired depth occurs during the shallow etch. Significant smoothing of deeply etched feature sidewalls also occurs during the shallow etch.

The present method can also be used for etching more than two patterns to different depths in a silicon substrate. According to this embodiment, a first patterned photoresist layer is used as a mask to pattern etch a hard mask layer to form openings for all features to be subsequently etched in the silicon substrate. A second patterned photoresist layer is then provided, which typically covers hard mask surfaces and which blocks off all of the openings in the patterned hard mask other than those that will be used for pattern etching of the deepest features. A deep etch is then performed, followed by removal of the second photoresist layer. A third patterned photoresist layer is then applied, which typically covers hard mask surfaces and which blocks off openings in the hard mask that will be used for pattern etching of shallow features. An intermediate etch is then performed, followed by removal of the third photoresist layer. Additional photoresist layers can be applied and patterned for use as masks in the pattern etching of successively more shallow features. The hard mask is then used for pattern etching of the most shallow features. One skilled in the art can envision various photoresist overlay patterns which can be used in sequence, in combination with a hard mask, to provide the desired topographical etch pattern in a crystalline substrate, such as a silicon substrate.

As an example of the method, disclosed herein is a method of etching variable depth features in a silicon substrate. A typical starting structure for performing the method includes, from top to bottom, a first patterned photoresist layer, a silicon oxide hard mask layer, and a silicon substrate. The silicon oxide hard mask layer is pattern etched, using a photoresist or other mask, to form openings in the silicon oxide and to expose portions of an upper surface of the silicon substrate. Silicon oxide pattern etching is performed by exposing the structure to a plasma generated from a first source gas which selectively etches the silicon oxide layer relative to the silicon substrate and relative to the photoresist. The first photoresist layer is then removed. A second patterned photoresist layer is then created over the structure. A portion of the second patterned photoresist layer covers (i.e., blocks) at least one opening formed in the silicon oxide hard mask layer. The silicon substrate is then pattern etched to form at least one deep feature, using the second patterned photoresist layer as a mask to protect the silicon substrate in areas where shallow features will be etched subsequently. Deep feature etching is typically performed using a cyclic silicon etch/polymer deposition process of the kind known in the art. The second photoresist layer is then removed. Finally, the silicon substrate is pattern etched to form at least one shallow feature, using the patterned silicon oxide hard mask layer. The term "shallow feature" is used herein to describe a feature having a depth which is less than the depth of a feature referred to herein as a "deep feature". A shallow feature will have an etch depth which is about 90% or less, typically 50% or less, than the etch depth of a deep feature. The shallow pattern etching is performed by exposing the structure to a plasma generated from a second source gas which selectively etches the silicon substrate relative to the silicon oxide hard mask. The second plasma source gas typically comprises about 10 to about 50 volume % $SF_6$, about 10 to about 50 volume % HBr, and about 10 to about 50 volume % $O_2$.

The method described above may be used in the formation of structures having applications in a wide variety of MEMS structures, including but not limited to biomedical MEMS, as well as MEMS in semiconductor device applications.

The etched silicon structure described above may be used as a mold in the production of biomedical MEMS devices. One embodiment mold structure comprises a silicon substrate having at least one reservoir and at least one channel formed therein, with at least one reservoir connected to at least one channel. The at least one reservoir has a diameter within the range of about 100 μm to about 5 mm and a depth within the range of about 50 μm to about 500 μm. The at least one channel has a width within the range of about 10 μm to about 100 μm, a depth within the range of about 10 μm to about 100 μm. When the channel cross-sectional area is less than about 10,000 μm$^2$, the channel is etched using a chemistry which provides a sidewall roughness of about 100 nm or less.

BRIEF DESCRIPTION OF THE DRAWINGS

FIG. 1G shows a schematic cross-sectional view of structure 100 after pattern etching of a channel 112, through opening 105, into silicon substrate 102, using overlying patterned silicon oxide layer 104 as a mask.

FIG. 1H shows a schematic cross-sectional view of structure 100 after removal of silicon oxide layer 104.

DETAILED DESCRIPTION OF EXEMPLARY EMBODIMENTS

Disclosed herein is a method of etching features to different depths in a silicon substrate. Exemplary processing conditions for performing various embodiments of the method of the invention are set forth below.

As a preface to the detailed description, it should be noted that, as used in this specification and the appended claims, the singular forms "a", "an", and "the" include plural referents, unless the context clearly dictates otherwise.

I. An Apparatus for Practicing the Invention

The embodiment example etch processes described herein were carried out in a CENTURA® Integrated Processing System available from Applied Materials, Inc., of Santa Clara, Calif. This apparatus is described in detail below to permit a better understanding of the invention; however, it is contemplated that other apparatus known in the industry may be used to carry out the etching process.

Figure 3A:
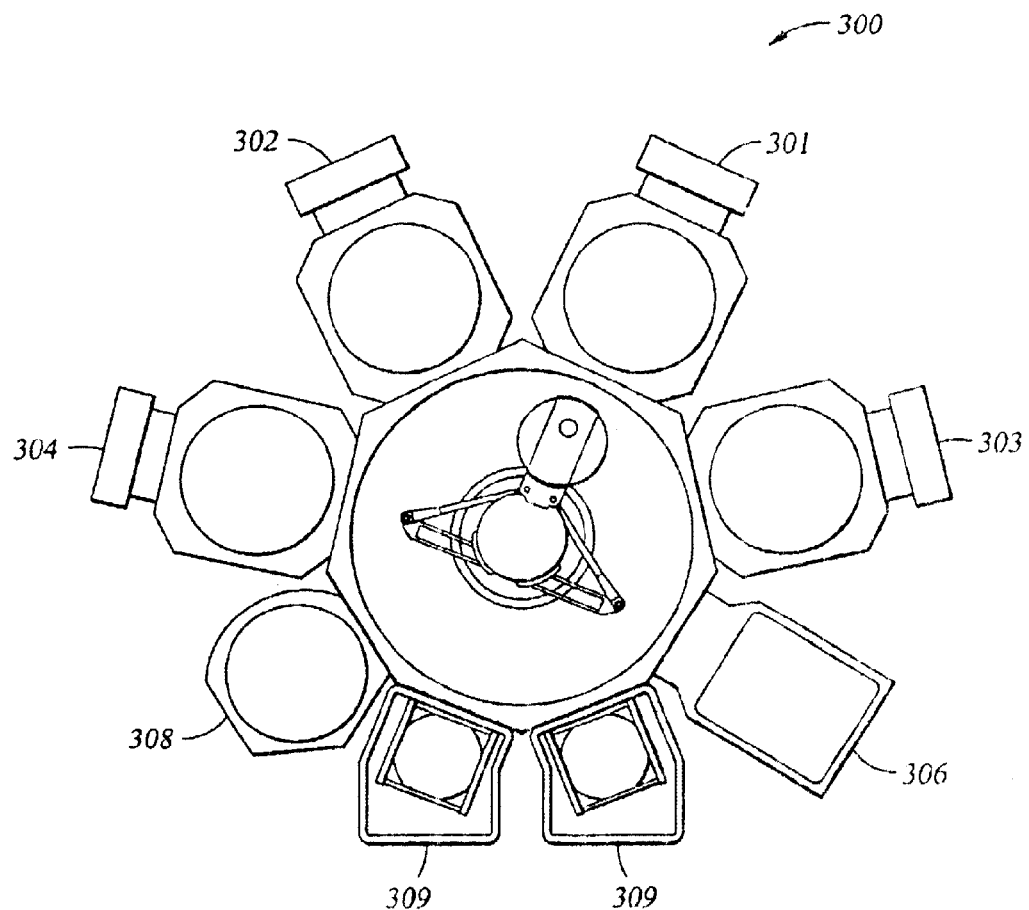
FIG. 3A illustrates a CENTURA® Integrated Processing System 300 of the kind which was used during the experimentation leading to the present invention.

FIG. 3A shows an elevation schematic of the CENTURA® Integrated Processing System 300. The CENTURA® Integrated Processing System 300 is a fully automated semiconductor fabrication system, employing a single-wafer, multi-chamber, modular design which accommodates a variety of wafer sizes. For example, as shown in FIG. 3A, the CENTURA® etch system may include etch chambers 301, 302; deposition chamber 303; advanced strip-and-passivation (ASP) chamber 304; wafer orienter chamber 306; cooldown chamber 308; and independently operated loadlock chambers 309.

Figure 3B:
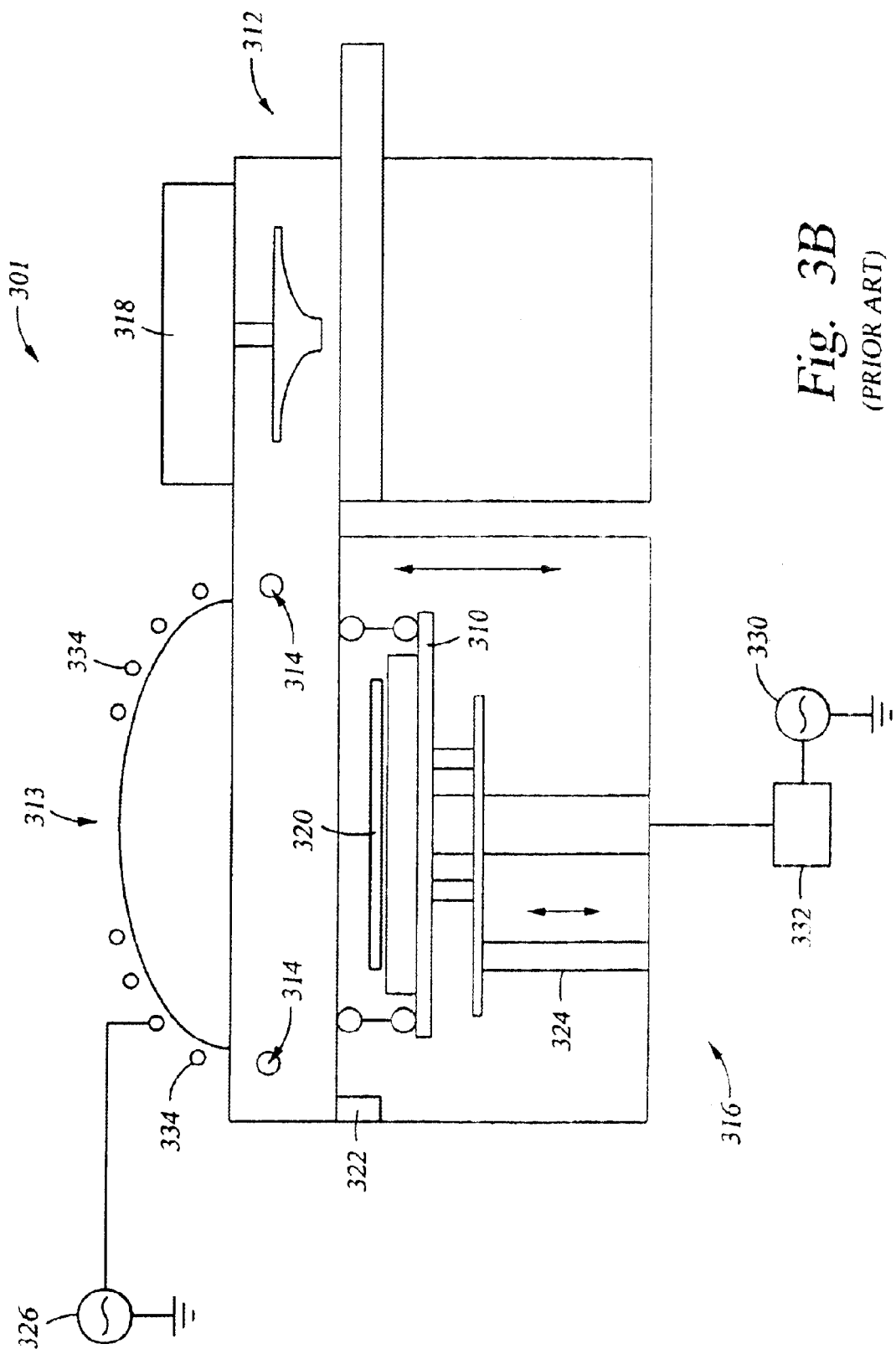
FIG. 3B shows a schematic of an individual CENTURA® DPS™ inductively coupled etch chamber 301 of the kind which was used during the experimentation leading to the present invention.

FIG. 3B is a schematic of an individual CENTURA® DPS™ etch chamber 301 of the type which may be used in the CENTURA® Integrated Processing System, commercially available from Applied Materials, Inc., Santa Clara, Calif. The equipment shown in schematic in FIG. 3B includes a Decoupled Plasma Source (DPS) of the kind described by Yan Ye et al. at the Proceedings of the Eleventh International Symposium of Plasma Processing, May 7, 1996, and as published in the Electrochemical Society Proceedings, Volume 96–12, pp. 222–233 (1996). The CENTURA® DPS™ etch chamber 302 is configured to be mounted on a standard CENTURA® mainframe.

The CENTURA® DPS™ etch chamber 301 consists of an upper chamber 312 having a ceramic dome 313, and a lower chamber 316. The lower chamber 316 includes an electrostatic chuck (ESC) cathode 310. Gas is introduced into the chamber via gas injection nozzles 314 for uniform gas distribution. Chamber pressure is controlled by a closed-loop pressure control system (not shown) with a throttle valve 318. During processing, a substrate 320 is introduced into the lower chamber 316 through inlet 322. The substrate 320 is held in place by means of a static charge generated on the surface of electrostatic chuck (ESC) cathode 310 by applying a DC voltage to a conductive layer located under a dielectric film on the chuck surface (not shown). The cathode 310 and substrate 320 are then raised by means of a wafer lift 324 and a seal is created against the upper chamber 312 in position for processing. Etch gases are introduced into the upper chamber 312 via the ceramic gas injection nozzles 314. The etch chamber 301 uses an inductively coupled plasma source power 326 operating at 2 MHz, which is connected to inductive coil 334 for generating and sustaining a high density plasma. The wafer is biased with an RF source 330 and matching network 332 operating within the range of 100 kHz to 13.56 MHz; more typically, within the range of 100 kHz to 2 MHz. Power to the plasma source 326 and substrate biasing means 330 are controlled by separate controllers (not shown).

The temperature on the surface of the etch chamber walls is controlled using liquid-containing conduits (not shown) which are located in the walls of the etch chamber 301. The temperature of the semiconductor substrate is controlled using the temperature of the electrostatic chuck cathode 310 upon which the substrate 320 rests. Typically, a helium gas flow is used to facilitate heat transfer between the substrate and the pedestal.

Figure 3C:
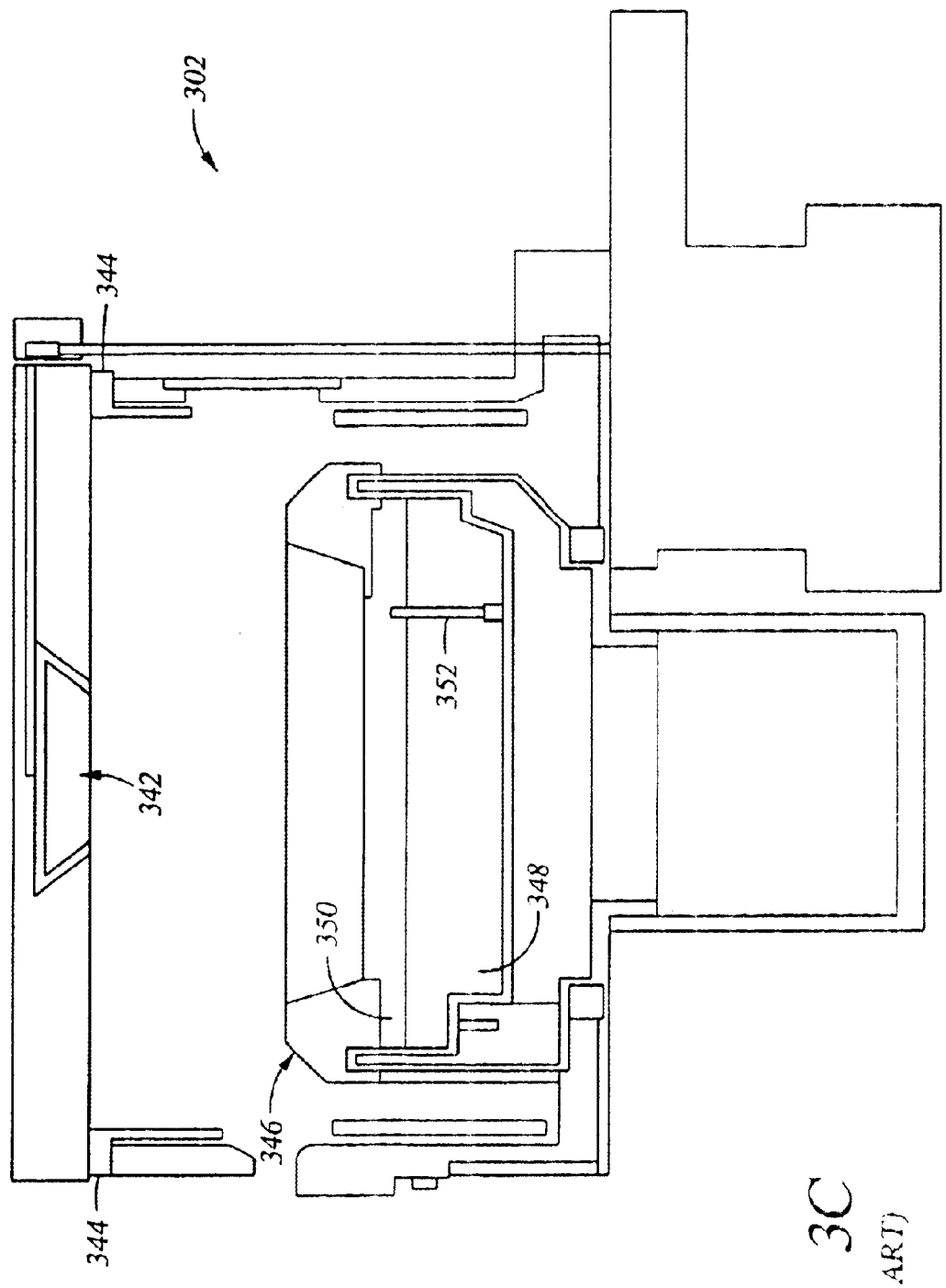
FIG. 3C is a schematic of an Applied Materials' MXP+ etch chamber 302 of the kind which was used during the experimentation leading to the present invention.

Alternatively, the embodiment etch processes of the invention may be performed in an etch processing apparatus wherein power to a plasma generation source and power to a substrate biasing means are controlled by a single power control, such as the Applied Materials' MXP or MXP+ etch chamber. FIG. 3C is a schematic of an Applied Materials' MXP+ etch chamber 302, which is a parallel plate plasma etch chamber of the kind which is well-known in the art. The MXP+ etch chamber offers advantages over other similar etch chambers in that it includes a simplified, two-dimensional gas distribution plate 342, which allows for more uniform gas distribution throughout the chamber. Another modification is a removable aluminum chamber liner 344, which can be easily removed and replaced during each wet cleaning procedure, allowing for a more rapid cleaning cycle. Yet another modification is an improved focus ring 346, which moves together with (rather than independently from) the cathode 348, resulting in reduced particle generation due to fewer moving parts within the apparatus. The high temperature cathode 348 has independent temperature control (not shown), which functions in response to a temperature reading from pedestal temperature probe 352, which permits operation at a temperature in excess of the process chamber temperature. The substrate to be processed (not shown) rests on an electrostatic chuck pedestal 350, which is joined to cathode 348.

Although the etch process chambers illustrated in FIGS. 3B and 3C and described above were used to process the substrates during the experimentation leading to the present invention, any of the etch processors available in the industry should be able to take advantage of the etch chemistries described herein, with some adjustment to other process parameters.

Figure 1A:
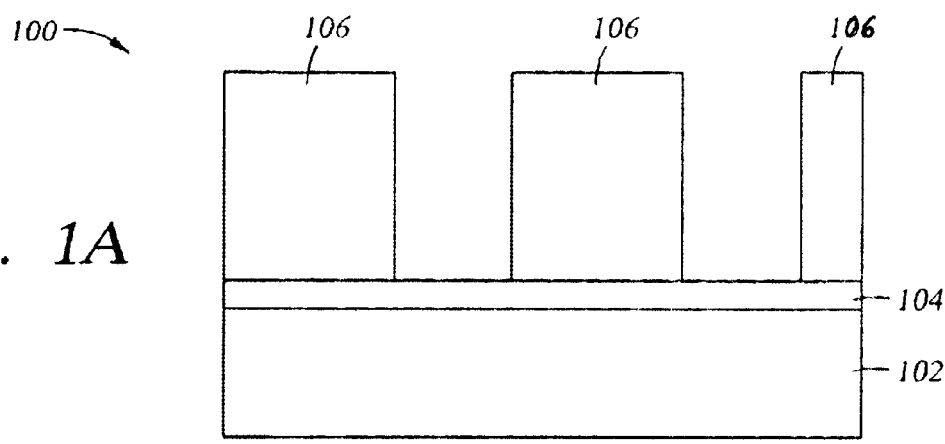
FIG. 1A shows a schematic cross-sectional view of a typical starting structure 100 for performing one embodiment method of the invention. Structure 100 includes, from top to bottom, a first patterned photoresist layer 106 and a silicon oxide layer 104, deposited overlying a single-crystal silicon substrate 102.

II. Exemplary Methods of Etching Variable Depth Features in a Silicon Substrate FIG. 1A shows a schematic cross-sectional view of a typical starting structure 100 for performing one embodiment of the invention. Structure 100 includes, from top to bottom, a first patterned photoresist layer 106 and a hard mask layer 104, deposited overlying a single-crystal silicon substrate 102. The embodiment method is described below with respect to the etching of a system of interconnected microfluid reservoirs (i.e., deep features) and channels (i.e., shallow features) in silicon substrate 102. However, the invention is not intended to be limited to this particular etch pattern.

In the embodiment example illustrated in FIGS. 1A–1H, the hard mask layer 104 was silicon oxide. Silicon oxide layer 104 typically has a thickness within the range of about 2000 Å to about 30,000 Å. Silicon oxide layer 104 is typically formed by thermal oxidation of silicon substrate 102, or is deposited from tetraethylorthosilicate (TEOS), using standard techniques known in the art, depending on the thickness of the oxide layer required.

Alternatively, hard mask layer 104 may comprise other materials, such as, by way of example and not by way of limitation, silicon nitride, silicon oxynitride, silicon carbide, chromium, aluminum, and copper. These materials are typically deposited using standard techniques known in the art, such as chemical vapor deposition (CVD) or physical vapor deposition (PVD).

The primary requirement is that the hard mask material must be substantially nonreactive with the plasma etchant which is subsequently used to etch the silicon substrate to form features of various sizes and depths. Typically, the hard mask material and the plasma etchant for etching the silicon are selected such that the plasma etchant provides a selectivity for etching silicon relative to the hard mask of about 20:1 or better.

First photoresist layer 106 is typically a photoresist which is sensitive to radiation within the range of about 500 nm to about 10,000 nm. Such photoresists are available from a number of manufacturers, including Shipley, Inc. (Marlboro, Mass.); JSR Microelectronic (Sunnyvale, Calif.); KTI (Tokyo, Japan); Clariant/AZ Electronic Materials (Somerville, N.J.); and DuPont (Wilmington, Del.). A typical film thickness for such a photoresist ranges from about 5000 Å to about 100,000 Å, but is dependent on the maximum depth of etching which is required and the selectivity for etching silicon relative to the particular photoresist used. The imaging and development methods for first photoresist layer 106 will depend on the particular photoresist material used and the pattern which is to be etched in the underlying substrate. Such development methods are well-known in the art.

Figure 1B:
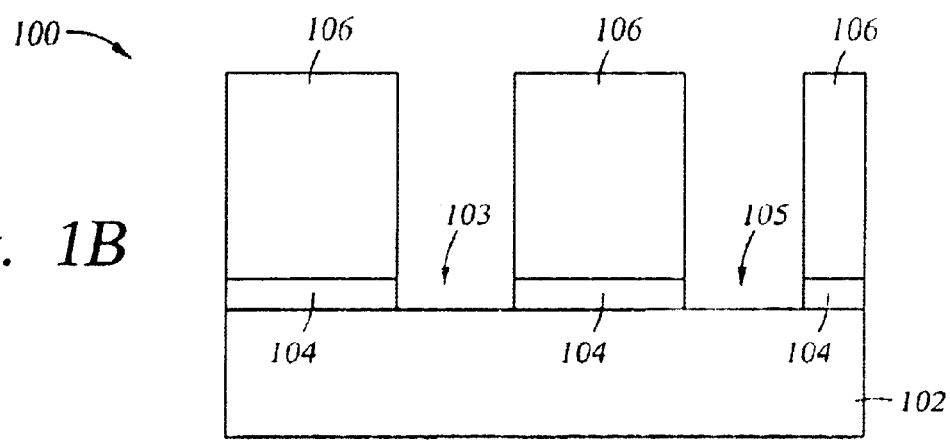
FIG. 1B shows a schematic cross-sectional view of structure 100 after pattern etching of silicon oxide layer 104 using first patterned photoresist layer 106 as a mask. Patterned silicon oxide layer 104 will subsequently be used as a hard mask during pattern etching of a reservoir and a channel into silicon substrate 102, in accordance with an embodiment method of the invention.

First patterned photoresist layer 106 is used as a mask to transfer the pattern to underlying silicon oxide layer 104. FIG. 1B shows a schematic cross-sectional view of structure 100 after pattern etching of silicon oxide layer 104. Openings 103, 105 within patterned silicon oxide layer 104 define locations where reservoirs and channels, respectively, are to be etched in subsequent processing steps. The widths of openings 103 and 105 define the widths of the subsequently etched reservoirs (where the width is typically a diameter) and of the channels. Reservoir openings 103 are typically pattern etched to have a diameter within the range of about 100 μm to about 5 mm; more typically, about 500 μm to about 2 mm. Channel openings 105 are typically pattern etched to have a width within the range of about 10 μm to about 100 μm; more typically, about 30 μm to about 50 μm.

Pattern etching of silicon oxide layer 104 is performed using a plasma source gas which is selective to etching silicon oxide layer 104 relative to silicon substrate 102. As used herein, the term "selectivity" or "etch selectivity" refers to a ratio of the etch rate of a first material (e.g., silicon oxide) to the etch rate of a second material (e.g., silicon) using a given plasma source gas and processing conditions. Typically, the plasma source gas provides a selectivity for etching silicon oxide relative to silicon of at least 50:1; more typically, at least 150:1.

A typical plasma source gas for etching silicon oxide includes about 25 to about 75 volume % $CF_4$ and about 25 to about 75 volume % $CHF_3$. A nonreactive diluent gas, including but not limited to argon, helium, neon, xenon, or krypton, may be included in the plasma source gas composition. Typical process conditions for pattern etching of silicon oxide layer 104 are as follows: 50–200 sccm of $CF_4$; 50–200 sccm of $CHF_3$; 20–250 mTorr process chamber pressure; 300–1500 W RF power; and 20° C.–50° C. substrate temperature. The process chamber wall temperature is typically within the range of about 20° C. to about 70° C. If the silicon oxide etch process is performed in a MXP or MXP+ chamber (illustrated in FIG. 3C), typical etch process conditions are as follows: 40 sccm of $CF_4$; 30 sccm of $CHF_3$; 60 sccm of Ar; 85 mTorr process chamber pressure; 650–1000 W RF power; 60 Gauss magnetic field; 8 Torr He back pressure; 20° C. cathode (substrate support) temperature; and 40° C. chamber wall temperature. Etching time will depend on the thickness of the silicon oxide layer being etched. For a silicon oxide layer having a thickness of 2 μm, the etch time is typically within the range of about 3 minutes to about 5 minutes.

Figure 1C:
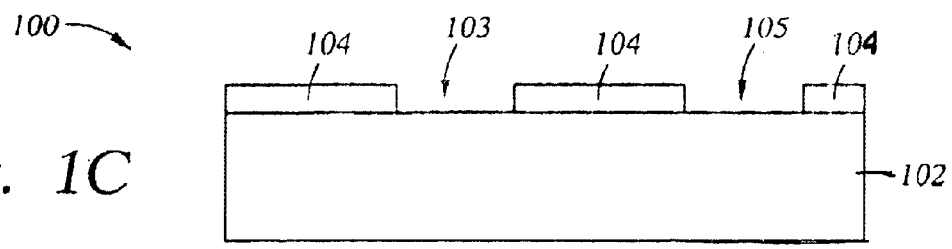
FIG. 1C shows a schematic cross-sectional view of structure 100 after removal of first photoresist layer 106.

Following pattern etching of silicon oxide layer 104, first photoresist layer 106 is removed using standard techniques known in the art for photoresist removal. One easy method is use of an oxygen-based plasma to consume the photoresist layer, which is typically an organic material. Oxygen ashing of photoresist materials is generally known in the art. FIG. 1C shows a schematic cross-sectional view of structure 100 after removal of first photoresist layer 106.

Following removal of first photoresist layer 106, a second photoresist layer 108 is deposited and patterned. Second photoresist layer 108 is typically a photoresist which is sensitive to radiation within the range of about 500 nm to about 10,000 nm. Such photoresists are available from a number of manufacturers, including Shipley, Inc. (Marlboro, Mass.); JSR Microelectronic (Sunnyvale, Calif.); KTI (Tokyo, Japan); Clariant/AZ Electronic Materials (Somerville, N.J.); and DuPont (Wilmington, Del.). A typical film thickness for such a photoresist ranges from about 5000 Å to about 100,000 Å, but is dependent on the maximum depth of etching which is required and the selectivity for etching silicon relative to the particular photoresist used. The imaging and development methods for second photoresist layer 108 will depend on the particular photoresist material used and the pattern which is to be etched in the underlying substrate. Such development methods are well-known in the art.

Figure 1D:
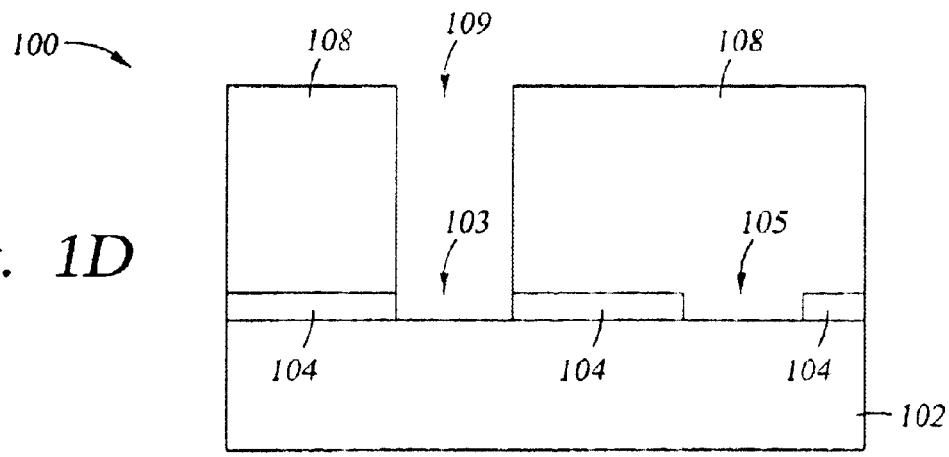
FIG. 1D shows a schematic cross-sectional view of structure 100 after deposition and patterning of second photoresist layer 108. A portion of second photoresist layer 108 covers an opening 105 in silicon oxide layer 104 which will subsequently be used during pattern etching of a channel into silicon substrate 102.

FIG. 1D shows a schematic cross-sectional view of structure 100 after deposition and patterning of second photoresist layer 108. Opening 109 formed in second photoresist layer 108 corresponds to the location of a reservoir to be subsequently etched in silicon substrate 102. The second photoresist layer 108 typically protects the entire silicon oxide hard mask 104 and covers (i.e., blocks) an opening 105 in silicon oxide hard mask 104. Opening 105 will subsequently be used during pattern etching of a channel into silicon substrate 102.

Figure 1E:
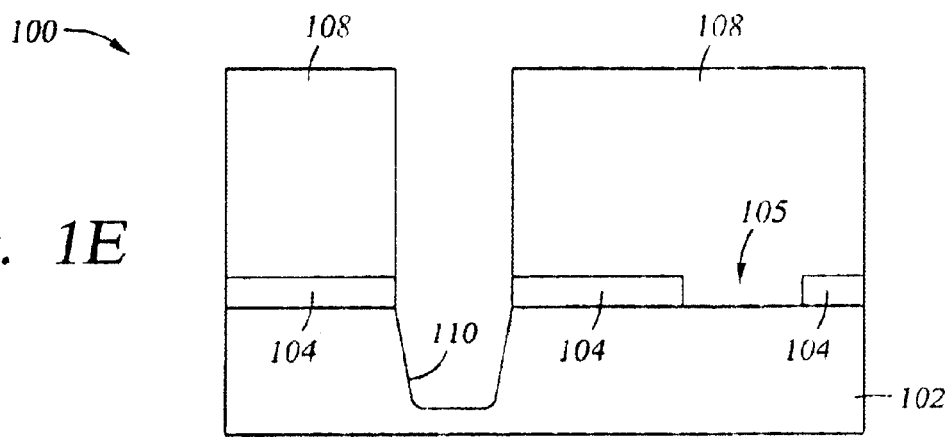
FIG. 1E shows a schematic cross-sectional view of structure 100 after pattern etching of a reservoir 110, at opening 103, into silicon substrate 102, using overlying second patterned photoresist layer 108 as a mask.

Referring to FIG. 1E, second patterned photoresist layer 108 is used as a mask during the pattern etching of a reservoir 110 into silicon substrate 102. Pattern etching of silicon substrate 102 to form reservoir 110 is typically performed using a cyclic silicon etch/polymer deposition process, of the kind known in the art. Such silicon etch/polymer deposition processes are disclosed, for example, in commonly owned, copending U.S. application Ser. No. 10/210,929, of J. Chinn et al., filed Aug. 2, 2002 ("the '929 Application"); U.S. Pat. No. 4,533,430, to Bower; U.S. Pat. No. 4,795,529, to Kawasaki et al.; U.S. Pat. No. 6,051,503, to Bhardwaj et al.; and U.S. Pat. Nos. 5,501,893, 6,127,273, and 6,284,148, to Laermer et al.

According to the method disclosed in the '929 Application (which is hereby incorporated by reference in its entirety), an etchant species which stabilizes the overall silicon etch process is used constantly during the etch process, while other etchant species and polymer-depositing species are applied intermittently, typically periodically, relative to each other. In another embodiment, the stabilizing etchant species is used constantly and a mixture of the other etchant species and polymer-depositing species is used intermittently.

The stabilizing etchant species are generated from a stabilizing plasma source gas selected from the group consisting of HBr, HCl, $Cl_2$, and combinations thereof. Typically, the stabilizing plasma source gas makes up from about 1 volumetric % to about 25 volumetric % of the total plasma source gas to the processing chamber. The intermittent plasma etchant species are generated from a gas selected from the group consisting of $SF_6$, $NF_3$, $CF_4$, $ClF_3$, $BrF_3$, $IF_3$, and combinations thereof, which are added to the stabilizing etchant species which are always present during the etching process. The intermittent plasma etchant species added to the stabilizing plasma species may also be HCl or $Cl_2$, in which case the HCl or $Cl_2$ or a combination thereof may be added to a different stabilizing etchant species, or may be increased in amount when some of the HCl or $Cl_2$ is already present as part of the stabilizing etchant species. The intermittent plasma etchant species may also be generated from a source gas selected from $C_2F_6$ or $C_3F_8$ when $O_2$ is added, where the concentration of O relative to the $C_2F_6$ or $C_3F_8$ is typically about 20% or less by volume. Typically, the intermittent plasma etchant species make up from about 25 volumetric % to about 50 volumetric % of the total plasma source gas feed. The polymer-depositing plasma species are generated from a gas selected from the group consisting of fluorocarbons such as $C_2F_6$, $C_3F_6$, $C_4F_6$, $C_4F_8$, $C_4F_{10}$; or hydrofluorocarbons such as $C_2H_2F_4$, $CHF_3$, $CH_2F_2$, $CH_3F$, $C_3HF_3$, $C_3H_2F_6$, $C_4H_5F$; or hydrocarbons such as $CH_4$, $C_2H_6$, or $C_3H_8$, where $CH_4$ is typically used. Combinations of any of these polymer-depositing species may also be used. Typically, the polymer-depositing plasma species make up from about 25 volumetric % to about 50 volumetric % of the total plasma source gas feed.

Process variables such as, but not limited to, plasma source gas feed rate, length of time intermittent etchant species are in contact with the substrate, length of time polymer-depositing species are in contact with the substrate, process chamber pressure, substrate temperature, process chamber wall temperature, plasma power applied for plasma generation and maintenance, and power applied to bias a substrate, may be increased (ramped up), decreased (ramped down), or remain constant as etching of a reservoir into the substrate continues. Depending on the particular application, it is helpful to maintain as many process variables as possible at a constant setting. When intermittent contact between the substrate and an etchant species or polymer deposition species is used, and the contact is periodic, the period itself may be frequency modulated.

Use of a stabilizing etchant (such as those listed above) continuously during the etch process enables a simplified, streamlined etch process, enables the formation of sidewalls having a controlled taper on recess etched features, while providing improved sidewall smoothness, as well as reducing the amount of microloading which occurs when dense and isolated features are etched on the same substrate during the same etch process. The method described in the '929 Application results in the formation of features having smooth sidewalls, having a roughness of less than about 1 $\mu$m, typically less than about 500 nm, and even more typically between about 100 nm and 200 nm, and a sidewall taper angle, which may be controlled to range from about 45° to about 90°, relative to an underlying substrate.

Total etch time (including polymer deposition steps) will depend on the desired depth of the reservoir 110 being etched. Reservoir 110 is typically etched to have a depth within the range of about 50 $\mu$m to about 500 $\mu$m; more typically, about 150 $\mu$m to about 400 $\mu$m. For a reservoir 110 depth of 150 $\mu$m, the total etch time is typically within the range of about 10 minutes to about 22 minutes.

Other cyclic silicon etch/polymer deposition etch processes of the kind described in the art may also be used to etch deep features, such as a reservoir into the substrate, and the present invention is not intended to be limited to the etch process described in the '929 Application.

Figure 1F:
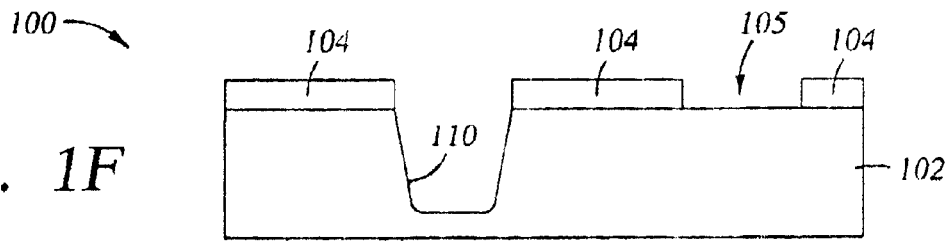
FIG. 1F shows a schematic cross-sectional view of structure 100 after removal of second photoresist layer 108.

Following pattern etching of silicon substrate 102 to form reservoir 110, second photoresist layer 108 is removed using standard techniques known in the art for photoresist removal. FIG. 1F shows a schematic cross-sectional view of structure 100 after removal of second photoresist layer 108.

Referring to FIG. 1G, patterned silicon oxide hard mask layer 104 is used for pattern etching of a channel 112 into silicon substrate 102. Pattern etching of silicon substrate 102 to form channel 112 is performed using a plasma source gas which is selective to etching silicon substrate 102 relative to silicon oxide layer 104. Typically, the plasma source gas provides a selectivity for etching silicon relative to silicon oxide of at least 10:1.

We have found that a plasma source gas comprising $SF_6$, HBr, and $O_2$ provides a selectivity for etching silicon relative to silicon oxide of about 20:1 or better. Generally, the plasma source gas includes about 10 to about 50 volume % $SF_6$, about 10 to about 50 volume % HBr, and about 10 to about 50 volume % $O_2$. Typically, the plasma source gas includes about 25 to about 40 volume % $SF_6$, about 25 to about 40 volume % HBr, and about 25 to about 40 volume % $O_2$. Typical process conditions for pattern etching of silicon oxide layer 104 are as follows: 25–100 sccm of $SF_6$; 25–100 sccm of HBr; 25–200 sccm of $O_2$; 20–75 mTorr process chamber pressure; 800–1300 W plasma source power; 7–30 W substrate bias power; and 13° C.–40° C. e-chuck (substrate support pedestal) temperature. The process chamber wall temperature is typically within the range of about 50° C. to about 80° C.

The plasma generated from the source gas composition and process conditions set forth above provides a channel 112 having very smooth sidewalls. Typically, if the silicon etch process conditions described above are used to etch channel 112, the sidewalls of channel 112 will have a surface roughness of about 100 nm or less; more typically, about 50 nm or less. Very smooth channel sidewalls are necessary in order to precisely calculate the exact volume of fluid which can be contained within channel 112. Any variation in channel dimensions resulting from non-uniform sidewalls will result in a deviation from the calculated channel volume. Deviation from the calculated channel volume will ultimately affect the results of chemical analyses performed using cartridges prepared using structure 100 as a mold. In addition, sidewall roughness in a channel may affect the fluid-flow characteristics of fluids flowing through the channel, also affecting the analytical results.

Etching time will depend on the desired depth of the channel 112 being etched. Channel 112 is typically etched to have a depth within the range of about 10 $\mu$m to about 100 $\mu$m; more typically, about 50 $\mu$m to about 80 $\mu$m. For a channel 112 depth of 30 $\mu$m, the etch time is typically within the range of about 6 minutes to about 14 minutes.

Because reservoir 110 is unmasked, continued downward etching of reservoir 110 typically occurs during etching of channel 112. However, since the desired depth of channel 112 is typically only about 5% to about 50% of the depth of reservoir 110, this is generally not a problem. The initial etch depth of reservoir 110 should take into account additional etching which will take place during etching of channel 112. The etch time during etching of reservoir 110 should be shortened by an appropriate amount of time to compensate for the continued etching of reservoir 110 which occurs during the channel etch step.

Following the channel etch step, silicon oxide layer 104 is typically removed by immersing the substrate in an HF acid bath (49% concentration) at 25° C., which provides a silicon oxide etch rate of approximately 1 micron per minute. The silicon oxide etch time will depend on the thickness of the silicon oxide layer 104, but is typically within the range of approximately 1 to 10 minutes. FIG. 1H shows a schematic cross-sectional view of structure 100 after removal of silicon oxide layer 104.

Figure 2A:
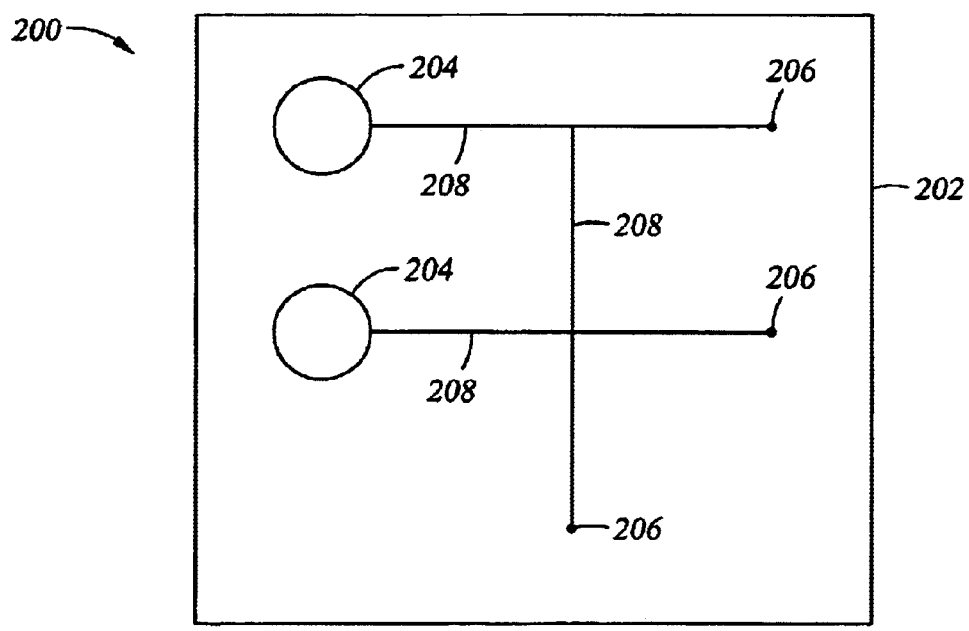
FIG. 2A shows a schematic top view of a structure 200 comprising a silicon substrate 202 having various size reservoirs 204, 206 and channels 208 formed therein, in accordance with an embodiment method of the invention.
Figure 2B:
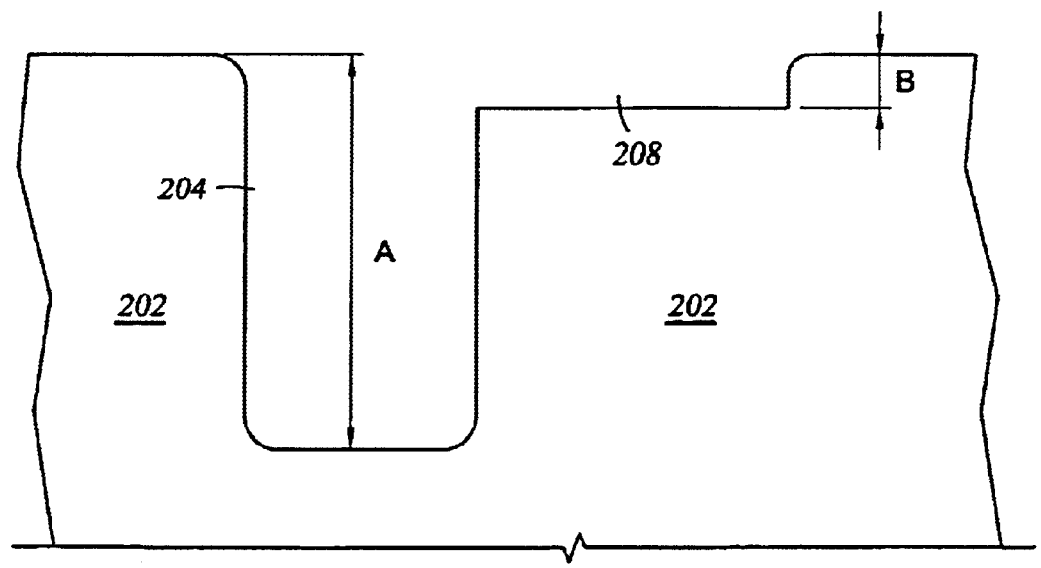
FIG. 2B shows a schematic cross-sectional view of a reservoir 204 having a depth A, and a channel 208 having a depth B.

FIG. 2A shows a schematic top view of a structure 200 comprising a silicon substrate 202 having various size reservoirs 204, 206 and channels 208 formed therein, according to the method described above with respect to FIGS. 1A–1H. FIG. 2B shows a schematic cross-sectional view of a reservoir 204 having a depth A, and a channel 208 having a depth B. Depth A of reservoir 204 is typically within the range of about 50 $\mu$m to about 500 $\mu$m; more typically, about 150 $\mu$m to about 400 $\mu$m. Depth B of channel 208 is typically within the range of about 10 $\mu$m to about 100 $\mu$m; more typically, about 50 $\mu$m to about 80 $\mu$m.

Structure 200 can be used as a mold in the production of biomedical MEMS devices. The mold is used to make a stamp, typically out of a metal, and the metal stamp is used to stamp the pattern into plastic pieces, which are to be used as biomedical MEMS devices. The plastic pieces have the same pattern of reservoirs and channels as those present in the silicon structure 200, and the surface roughness in the plastic tends to mirror the surface roughness which was present on silicon structure 200.

Referring back to FIG. 1H, reservoir 110 and channel 112 are typically formed to have bottom corners 111 and 113, respectively, having radii $\theta_3$ and $\theta_4$, respectively, ranging from about 2 $\mu$m to about 8 $\mu$m. In addition, defined top corners 115 and 117, of reservoir 110 and channel 112, respectively, have radii $\theta_1$ and $\theta_2$, respectively, ranging from about 2 $\mu$m to about 8 $\mu$m. The sidewalls of reservoir 110 and channel 112 are typically etched to have tapered profile angles $\theta_5$ and $\theta_6$, respectively, ranging from about 45° to about 90°. In particular, the defined top corners 115, 117 allow precise calculation of the volume of fluid in channel 112, and also prevent the seepage of fluids from reservoir 110 and channel 112 onto the top surface of substrate 102 which could occur if reservoir 110 and channel 112 were formed with less defined (i.e., more rounded) top corners. Tapered sidewalls facilitate release of molded parts, as compared with sidewalls which are either perfectly vertical or undercut relative to the substrate surface.

If the reservoir and channel top corners 115 and 117, respectively, are not as defined as desired after performance of the channel etch step, an optional finishing step can be performed which will provide more defined top corners. The optional finishing step involves filling reservoir 110 and channel 112 with silicon oxide (typically, using a thermal oxidation process); planarizing the substrate surface (typically, using a chemical-mechanical polishing process); then immersing the entire substrate in an HF acid bath (49% concentration) at 25° C. (which provides a silicon oxide etch rate of approximately 1 micron per minute) to remove the silicon oxide from reservoir 110 and channel 112. The silicon oxide etch time will depend on the thickness of the silicon oxide layer, but is typically within the range of about 10 seconds to about 240 seconds. The thickness of the silicon oxide layer should therefore be controlled in order to minimize the amount of time that the substrate 102 is exposed to the HF bath.

Although the silicon structure of the present invention is discussed above with respect to its use as a mold in the production of biomedical MEMS devices, it is contemplated that such silicon structures can be used in a variety of MEMS applications, including MEMS in semiconductor device applications.

The present method can also be used for etching more than two patterns to different depths in a silicon substrate. According to this embodiment, a first patterned photoresist layer is used as a mask to pattern etch a hard mask layer to form openings for all features to be subsequently etched in the silicon substrate. A second patterned photoresist layer is then provided, which typically covers hard mask surfaces and which blocks off all of the openings in the patterned hard mask other than those that will be used for pattern etching of the deepest features. A deep etch is then performed, followed by removal of the second photoresist layer. A third patterned photoresist layer is then applied, which typically covers hard mask surfaces and which blocks off openings in the hard mask that will be used for pattern etching of shallow features. An intermediate etch is then performed, followed by removal of the third photoresist layer. Additional photoresist layers can be applied and patterned for use as masks in the pattern etching of successively more shallow features. The hard mask is then used for pattern etching of the most shallow features. One skilled in the art can envision various photoresist overlay patterns which can be used in sequence, in combination with a hard mask, to provide the desired topographical etch pattern in a silicon substrate.

One skilled in the art to which the invention belongs would realize that there are a number of crystalline substrates and hard masking materials which can be used to carry out the general method of the invention. One would select the etch chemistry and process parameters based on the particular crystalline substrate, hard masking material, and photoresist used.

The above described exemplary embodiments are not intended to limit the scope of the present invention, as one skilled in the art can, in view of the present disclosure expand such embodiments to correspond with the subject matter of the invention claimed below.

We claim:

1. A method of etching variable depth features in a crystalline substrate, comprising the following steps, performed in the following order:
    a) providing a structure including, from top to bottom, a first patterned photoresist layer, a hard mask layer, and a crystalline substrate;
    b) pattern etching said hard mask layer by exposing said structure to a plasma generated from a first plasma source gas which selectively etches said hard mask layer relative to said crystalline substrate, whereby a plurality of openings are formed in said hard mask layer, and whereby portions of an upper surface of said crystalline substrate are exposed through said openings;
    c) removing said first photoresist layer;
    d) providing a second patterned photoresist layer overlying said structure, whereby a portion of said second patterned photoresist layer covers at least one opening formed in said hard mask layer;
    e) pattern etching said crystalline substrate using said second patterned photoresist layer as a mask, whereby at least one deep feature is formed in said crystalline substrate;
    f) removing said second photoresist layer;
    g) pattern etching said crystalline substrate using said patterned hard mask layer, by exposing said structure to a plasma generated from a second plasma source gas which selectively etches said crystalline substrate relative to said hard mask layer, whereby at least one shallow feature is formed in said crystalline substrate, and wherein a sidewall of said at least one shallow feature has a surface roughness of about 200 nm or less.

2. The method of claim 1, wherein said crystalline substrate is single-crystal silicon.

3. The method of claim 1, wherein said hard mask layer comprises a material selected from the group consisting of silicon oxide, silicon nitride, silicon oxynitride, silicon carbide, chromium, aluminum, and copper.

4. The method of claim 2, wherein said hard mask layer comprises silicon oxide.

5. The method of claim 4, wherein said first plasma source gas which selectively etches said silicon oxide layer relative to said silicon substrate comprises $CF_4$ and $CHF_3$.

6. The method of claim 2, wherein said at least one deep feature is etched in step e) using a cyclic silicon etch/polymer deposition process.

7. The method of claim 4, wherein said second plasma source gas which selectively etches said silicon substrate relative to said silicon oxide layer comprises $SF_6$, HBr, and $O_2$.

8. The method of claim 7, wherein said second plasma source gas comprises about 10 to about 50 volume % $SF_6$, about 10 to about 50 volume % HBr, and about 10 to about 50 volume % $O_2$.

9. The method of claim 8, wherein said second plasma source gas comprises about 25 to about 40 volume % $SF_6$, about 25 to about 40 volume % HBr, and about 25 to about 40 volume % $O_2$.

10. The method of claim 1, wherein a sidewall of said at least one shallow feature has a roughness of about 100 nm or less.

11. The method of claim 10, wherein a sidewall of said at least one shallow feature has a roughness of about 50 nm or less.

12. The method of claim 1, wherein said at least one deep feature is etched to have a diameter within the range of about 100 μm to about 5 mm.

13. The method of claim 1, wherein said at least one deep feature is etched to have a depth within the range of about 50 μm to about 500 μm.

14. The method of claim 1, wherein said at least one deep feature is etched to have a sidewall profile angle within the range of about 45° to about 90°.

15. The method of claim 1, wherein said at least one shallow feature is etched to have a width within the range of about 10 μm to about 100 μm.

16. The method of claim 1, wherein said at least one shallow feature is etched to have a depth within the range of about 10 μm to about 100 μm.

17. The method of claim 1, wherein said at least one shallow feature is etched to have a sidewall profile angle within the range of about 45° to about 90°.

18. The method of claim 1, wherein said method further includes a finishing step h), comprising:
   h-1) filling said at least one deep feature and said at least one shallow feature with silicon oxide;
   h-2) planarizing said substrate surface; and
   h-3) immersing said substrate in an HF acid bath for a period of time ranging from about 10 seconds to about 240 seconds, whereby said silicon oxide is removed from said at least one deep feature and said at least one shallow feature.

19. The method of claim 1, wherein said method is performed such that at least one deep feature connects with at least one shallow feature.

20. The method of claim 1, wherein a final structure resulting from performance of said method is used as a mold in the production of biomedical MEMS devices.

21. A method of preparing a mold including at least one reservoir and at least one channel, for use in the production of biomedical MEMS devices, comprising the following steps, performed in the following order:
   a) providing a structure including, from top to bottom, a first patterned photoresist layer, a silicon oxide layer, and a silicon substrate;
   b) pattern etching said silicon oxide layer by exposing said structure to a plasma generated from a first source gas which selectively etches said silicon oxide layer relative to said silicon substrate, whereby a plurality of openings are formed in said silicon oxide layer, and whereby portions of an upper surface of said silicon substrate are exposed through said openings;
   c) removing said first photoresist layer;
   d) providing a second patterned photoresist layer overlying said structure, whereby a portion of said second patterned photoresist layer covers at least one opening formed in said silicon oxide layer;
   e) pattern etching said silicon substrate using said second patterned photoresist layer as a mask, whereby at least one reservoir is formed in said silicon substrate;
   f) removing said second photoresist layer;
   g) pattern etching said silicon substrate using said patterned silicon oxide layer as a mask, by exposing said structure to a plasma generated from a second source gas which selectively etches said silicon substrate relative to said silicon oxide layer, whereby at least one channel is formed in said silicon substrate.

* * * * *